United States Patent [19]

Chao

[11] Patent Number: 5,763,305
[45] Date of Patent: Jun. 9, 1998

[54] METHOD FOR FORMING A SEMICONDUCTOR MEMORY DEVICE WITH A CAPACITOR

[75] Inventor: Fang-Ching Chao, Hsinchu, Taiwan

[73] Assignee: United Microelectronics Corporation, Taiwan

[21] Appl. No.: 784,298

[22] Filed: Jan. 16, 1997

[30] Foreign Application Priority Data

Aug. 16, 1996 [TW] Taiwan .................. 85109997

[51] Int. Cl.$^6$ ............................. H01L 21/8242
[52] U.S. Cl. ............... 438/253; 438/254; 438/396; 438/397; 148/DIG. 14
[58] Field of Search ............................ 438/239, 253, 438/254, 381, 396, 397; 148/DIG. 14

[56] References Cited

U.S. PATENT DOCUMENTS

| | | |
|---|---|---|
| 5,071,783 | 12/1991 | Taguchi et al. . |
| 5,077,688 | 12/1991 | Kumanoya et al. . |
| 5,089,869 | 2/1992 | Matsuo et al. . |
| 5,102,820 | 4/1992 | Chiba . |
| 5,126,810 | 6/1992 | Gotou . |
| 5,142,639 | 8/1992 | Kohyama et al. . |
| 5,155,657 | 10/1992 | Oehrlein et al. . |
| 5,158,905 | 10/1992 | Ahn . |
| 5,164,337 | 11/1992 | Ogawa et al. . |
| 5,172,201 | 12/1992 | Suizu . |
| 5,196,365 | 3/1993 | Gotou . |
| 5,206,787 | 4/1993 | Fujioka . |
| 5,266,512 | 11/1993 | Kirsch . |
| 5,274,258 | 12/1993 | Ahn . |
| 5,338,955 | 8/1994 | Tamura et al. . |
| 5,354,704 | 10/1994 | Yang et al. . |
| 5,371,701 | 12/1994 | Lee et al. . |
| 5,389,568 | 2/1995 | Yun .................. 437/919 |
| 5,399,518 | 3/1995 | Sim et al. . |
| 5,438,011 | 8/1995 | Blalock et al. . |
| 5,443,993 | 8/1995 | Park et al. . |
| 5,453,633 | 9/1995 | Yun . |
| 5,460,996 | 10/1995 | Ryou . |
| 5,478,768 | 12/1995 | Iwasa . |
| 5,478,770 | 12/1995 | Kim . |
| 5,482,886 | 1/1996 | Park et al. . |
| 5,508,222 | 4/1996 | Sakao . |

(List continued on next page.)

FOREIGN PATENT DOCUMENTS

| | | |
|---|---|---|
| 0 516 031 A1 | 12/1992 | European Pat. Off. . |
| 4-26156 | 1/1992 | Japan . |
| 5-21745 A | 1/1993 | Japan . |
| 5-251657 | 9/1993 | Japan . |
| 2 252 447 | 8/1992 | United Kingdom . |

OTHER PUBLICATIONS

Ema et al., "3–Dimensional Stacked Capacitor Cell for 16M and 64M DRAMS", International Electron Devices Meeting, pp. 592–595, Dec. 1988.

Wakamiya et al., "Novel Stacked Capacitor Cell for 64–Mb DRAM", 1989 Symposium on VLSI Technology Digest of Technical Papers, pp. 69–70.

"Mini–Trenches in Polysilicon For Dram Storage Capacitance Enhancement", IBM Technical Disclosure Bulletin, vol. 33, No. 9, Feb. 1991.

*Primary Examiner*—Tuan H. Nguyen
*Attorney, Agent, or Firm*—Rabin, Champagne & Lynt, P.C.

[57] ABSTRACT

A method of fabricating a semiconductor memory device having a capacitor. First, a first insulating layer is formed on a substrate to cover the transistor. Next, a second insulating layer and a first conductive layer are formed in order. The first conductive layer only covers a portion of the second insulating layer to form a branch-like conductive layer. Then, a third insulating layer is formed. An opening is next formed. A second conductive layer is filled into the opening and therefore electrically connected to the source/drain region of the transistor to form a trunk-like conductive layer. Next, the second and the third insulating layers are removed. After a dielectric film is formed on the exposed surfaces of the first and second conductive layers, a third conductive layer is formed on the dielectric film to form an opposed electrode.

58 Claims, 9 Drawing Sheets

U.S. PATENT DOCUMENTS

| | | |
|---|---|---|
| 5,521,419 | 5/1996 | Wakamiya et al. . |
| 5,523,542 | 6/1996 | Chen et al. ............................ 437/60 |
| 5,543,346 | 8/1996 | Keum et al. . |
| 5,550,080 | 8/1996 | Kim ........................................ 437/919 |
| 5,561,309 | 10/1996 | Cho et al. . |
| 5,561,310 | 10/1996 | Woo et al. . |
| 5,572,053 | 11/1996 | Ema . |
| 5,595,931 | 1/1997 | Kim ........................................ 437/919 |

METHOD FOR FORMING A SEMICONDUCTOR MEMORY DEVICE WITH A CAPACITOR

BACKGROUND OF THE INVENTION

1. Field of the Invention

This invention relates in general to semiconductor memory devices, and more particularly to a structure of a dynamic random access memory (DRAM) cell substantially composed of a transfer transistor and a charge storage capacitor.

2. Description of the Related Art

FIG. 1 is a circuit diagram of a memory cell (DRAM cell) for a DRAM device. As shown in the drawing, the DRAM cell is substantially composed of a transfer transistor T and a charge storage capacitor C. The transfer transistor T has a source connected to a corresponding bit line BL, and a drain connected to a storage electrode 6 of the charge storage capacitor C. The transfer transistor T further has a gate connected to a corresponding word line WL. The capacitor C has an electrode 8 opposite to the storage electrode 6, which is connected to a constant power source. A dielectric film 7 is provided between the storage electrode 6 and the electrode 8.

In the DRAM manufacturing process, a two-dimensional capacitor known as a planar type capacitor is typically used with conventional DRAMs having a storage capacity less than 1 Mb. With these DRAMs, electric charges are stored on the main surface of a semiconductor substrate. Thus, the main surface must have a large area. This type of a memory cell is therefore not suitable for a DRAM having a high degree of integration. For a high integration DRAM, such as a DRAM with more than 4 Mb of memory, a three-dimensional capacitor, known as a stacked-type or a trench-type capacitor, is known.

With stacked-type or trench-type capacitors, it is possible to obtain a larger memory in a similar volume. However, to provide a semiconductor device having an even higher degree of integration, such as a very-large-scale integration (VLSI) circuit having a capacity of 64 Mb, a capacitor having a simple three-dimensional structure such as the conventional stacked-type or trench-type capacitor, is insufficient.

One solution for improving the capacitance of a capacitor is to use a fin-type stacked capacitor, which is proposed in Ema et al., "3-Dimensional Stacked Capacitor Cell for 16M and 64M DRAMs", International Electron Devices Meeting, pp. 592–595, December 1988. The fin-type stacked capacitor includes electrodes and dielectric films which extend in a fin shape in a plurality of stacked layers. DRAMs having the fin-type stacked capacitor are also disclosed in U.S. Pat. Nos. 5,071,783 (Taguchi et al.); 5,126,810 (Gotou); 5,196,365 (Gotou); and 5,206,787 (Fujioka).

Another solution for improving the capacitance of a capacitor is to use a cylindrical-type stacked capacitor, which is proposed in Wakamiya et al., "Novel Stacked Capacitor Cell for 64-Mb DRAM", 1989 Symposium on VLSI Technology Digest of Technical Papers, pp. 69–70. The cylindrical-type stacked capacitor includes electrodes and dielectric films which extend in a cylindrical shape to increase the surface areas of the electrodes. A DRAM having the cylindrical-type stacked capacitor also is disclosed in U.S. Pat. No. 5,077,688 (Kumanoya et al.).

With the trend toward increased integration density, the size of the DRAM cell in a plane (the area the cell occupies in a plane) must be further reduced. Generally, a reduction in the size of the cell leads to a reduction in the charge storage capacity (capacitance). Additionally, as the capacitance is reduced, the likelihood of soft errors arising from the incidence of α-rays is increased. Therefore, there is a need in this art to provide a new structure of a storage capacitor which can achieve the same capacitance, while occupying a smaller area in a plane, and a suitable method of fabricating the structure.

SUMMARY OF THE INVENTION

It is therefore an object of the present invention to provide a method of fabricating a semiconductor memory device which includes a tree-type capacitor that has an increased area for charge storage.

A method of forming a storage electrode of a storage capacitor of a semiconductor memory device is disclosed. The semiconductor memory device comprises a substrate, a transfer transistor formed on the substrate, and a storage capacitor electrically connected to one of the source/drain regions of the transfer transistor. A first insulating layer is formed over the transfer transistor. A first conductive layer is formed so that it penetrates at least the first insulating layer and is electrically connected to the source/drain region. A second insulating layer is formed on the first conductive layer, wherein the second insulating layer has a knoll substantially over the source/drain region. A second conductive layer is formed on the second insulating layer, at least covering the knoll of the second insulating layer. A third insulating layer is next formed. An opening is formed through the third insulating layer, the second conductive layer and the second insulating layer so that a portion of the first conductive layer is exposed. A third conductive layer is formed in the opening. The first conductive layer is patterned, whereby the first and third conductive layer form a trunk-like conductive layer, and the second conductive layer forms a branch-like conductive layer. The trunk-like and branch-like conductive layers thus form a storage electrode of the storage capacitor. The second and third insulating layers are removed. A dielectric layer is formed on the exposed surfaces of the first, second, and third conductive layers. A fourth conductive layer is formed on the surface of the dielectric layer to form an opposed electrode.

It is another object of the invention to provide a method of forming a storage electrode of a storage capacitor of a semiconductor memory device. The semiconductor memory device includes a substrate, a transfer transistor formed on the substrate, and a storage capacitor electrically connected to a source/drain region of the transfer transistor. A first insulating layer is formed over the transfer transistor on the substrate. A second insulating layer is formed over the first conductive layer. The second insulating layer has a knoll substantially over the source/drain region. A first conductive layer is formed on a portion of the second insulating layer and at least over the knoll of the second insulating layer. A third insulating layer is formed over the substrate. An opening is formed through the third insulating layer, the first conductive layer, the second insulating layer and the first insulating layer so that the source/drain region is exposed. A second conductive layer is formed in the opening so that the second conductive layer is electrically connected to the source/drain region. Consequently, the second conductive layer forms a trunk-like conductive layer. The first conductive layer forms a branch-like conductive layer. The trunk-like and branch-like conductive layers form a storage electrode of the storage capacitor. The second and third insulating layers are removed. A dielectric layer is formed on the exposed surfaces of the first and second conductive layers. A third conductive layer is formed on the surface of the dielectric layer to form an opposed electrode.

BRIEF DESCRIPTION OF THE DRAWINGS

Other objects, features, and advantages of the invention will become apparent from the following detailed description of the preferred but non-limiting embodiments. The description is made with reference to the accompanying drawings in which.

DESCRIPTION OF THE PREFERRED EMBODIMENTS

First Preferred Embodiment

A first preferred embodiment of the invention relating to a semiconductor memory device with tree-type storage capacitor is described in detail with reference to FIG. 2A to FIG. 2F.

Figure 1:
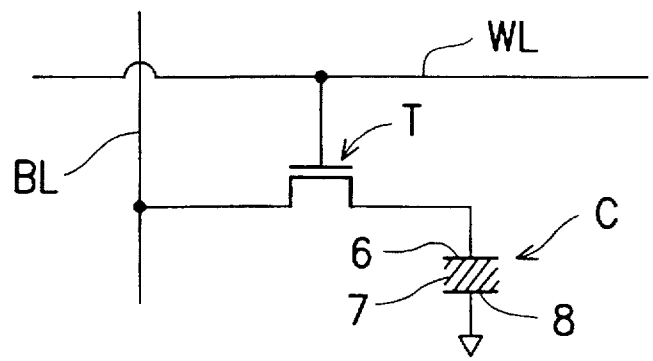
FIG. 1 is a circuit diagram of a known memory cell of a DRAM device.
Figure 2A:
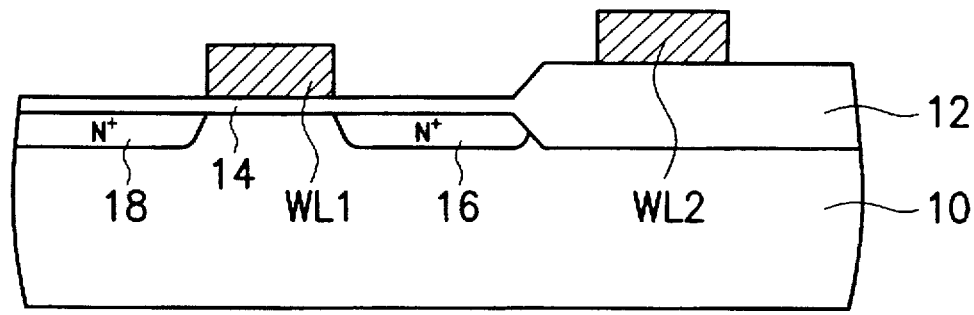
FIGS. 2A through 2F are cross-sectional views depicting the process steps for fabricating a first embodiment of a semiconductor memory cell having a tree-type capacitor according to the invention.

Referring to FIG. 2A, the surface of a silicon substrate 10 is firstly thermal oxidized by, for example, using local oxidation (LOCOS) technique. A field oxide layer 12 with a thickness of about 3000 angstroms is thus formed on the surface of the silicon substrate 10. Next, a thermal oxidation process is performed, to form a gate oxide layer 14 with a thickness of about 150 angstroms over the surface of the silicon substrate 10. Then, by using chemical vapor deposition (CVD) or low pressure chemical vapor deposition (LPCVD), a polysilicon layer with a thickness of about 2000 angstroms is deposited over the entire surface of the silicon substrate 10. To improve the conductivity of the polysilicon layer, phosphorus ions can be implanted into the polysilicon layer. Preferably, a refractory metal layer is deposited and an anneal process is performed to form a polycide layer. Consequently, the conductivity is further enhanced. The refractory metal can be, for example, tungsten, and is deposited to a thickness of about 2000 angstroms. Thereafter, a conventional photolithography and an etching technique are performed in order to pattern the polycide layer. Therefore, gates WL1 and WL2 (or word lines WL I and WL2) are formed as shown in FIG. 2A. Next, arsenic ions are implanted into the substrate 10 to form drain region 16 and source region 18. During this step of implantation, the word lines WL1 and WL2 are used as mask layers with a dosage of about $1\times10^{15}$ atoms/cm$^2$ and an energy of about 70 KeV.

Figure 2B:
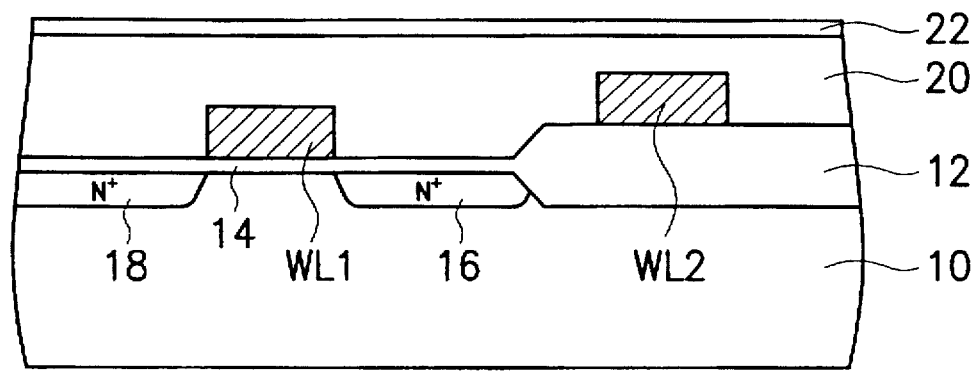

Referring next to FIG. 2B, a planarized insulating layer 20, such as borophosphosilicate glass (BPSG) with a thickness of about 7000 angstroms, is deposited by CVD. Then, an etching protection layer 22, such as a silicon nitride layer with a thickness of about 1000 angstroms, is formed by CVD.

Figure 2C:
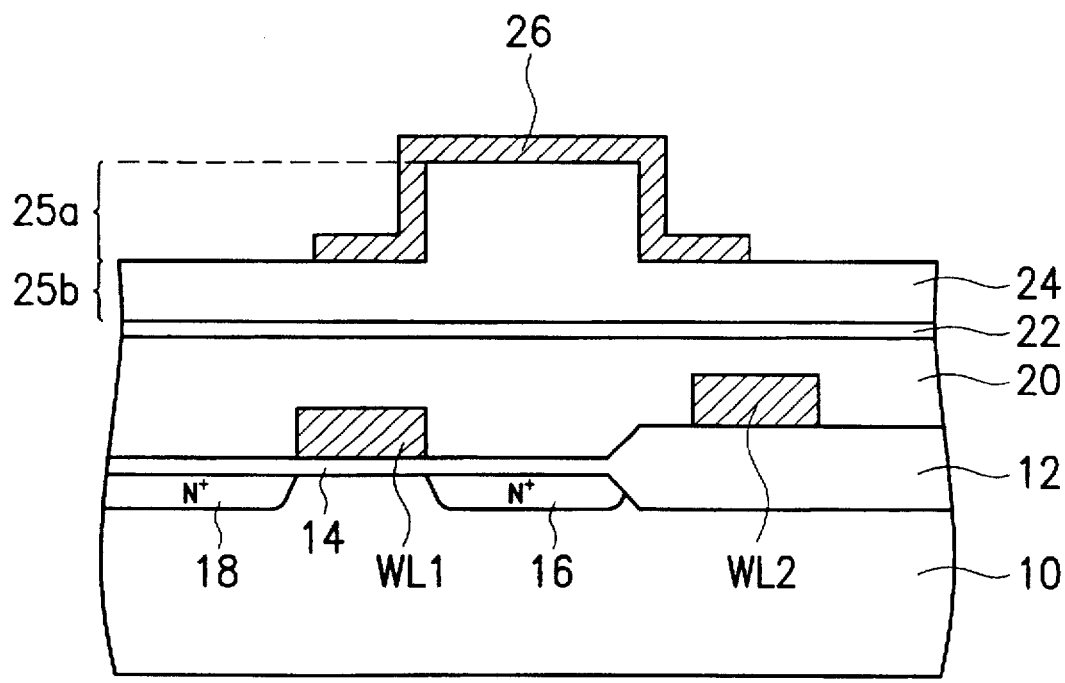

Referring to FIG. 2C, a thick insulating layer, such as a silicon dioxide layer with a thickness of about 7000 angstroms, is deposited by CVD. A portion of the thick insulating layer is removed by a conventional photolithography and etching technique so that a hill-like insulating layer 24 is formed. The hill-like insulating layer 24 includes a knoll 25a and a base 25b. The knoll 25a is substantially above the drain region 16. Next, a polysilicon layer 26 is deposited by CVD on the hill-like insulating layer 24. A portion of the polysilicon layer 26 above the base 25b is removed, by conventional photolithography and etching techniques. The etched polysilicon layer 26 forms a portion of the storage electrode. The thickness of the polysilicon layer 26 can be, for example, 1000 angstroms. Ions, such as arsenic, can be implanted into the polysilicon layer 26 to increase its conductivity.

Figure 2D:
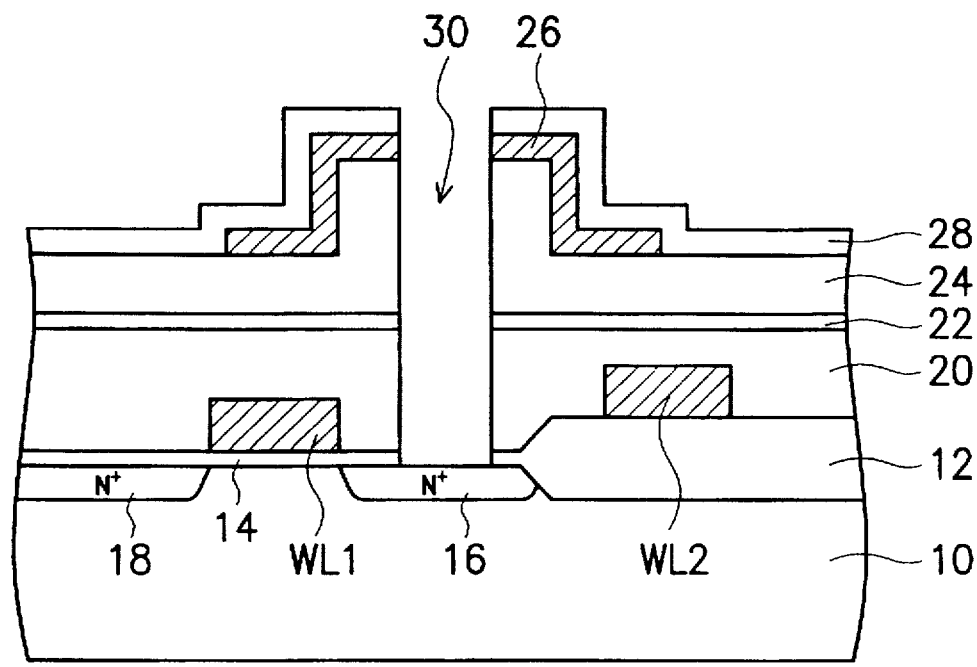

Referring to FIG. 2D, an insulating layer 28 is deposited over the polysilicon layer 26 and the insulating layer 24, using CVD. The insulating layer 28 can be a silicon dioxide layer with a thickness of about 1000 angstroms. Next, the insulating layer 28, the polysilicon layer 26, the insulating layer 24, the etching protection layer 22, the insulating layer 20 and the gate oxide layer 14 are etched in succession, using conventional photolithography and etching techniques, to form a contact hole 30 of the storage electrode.

Figure 2E:
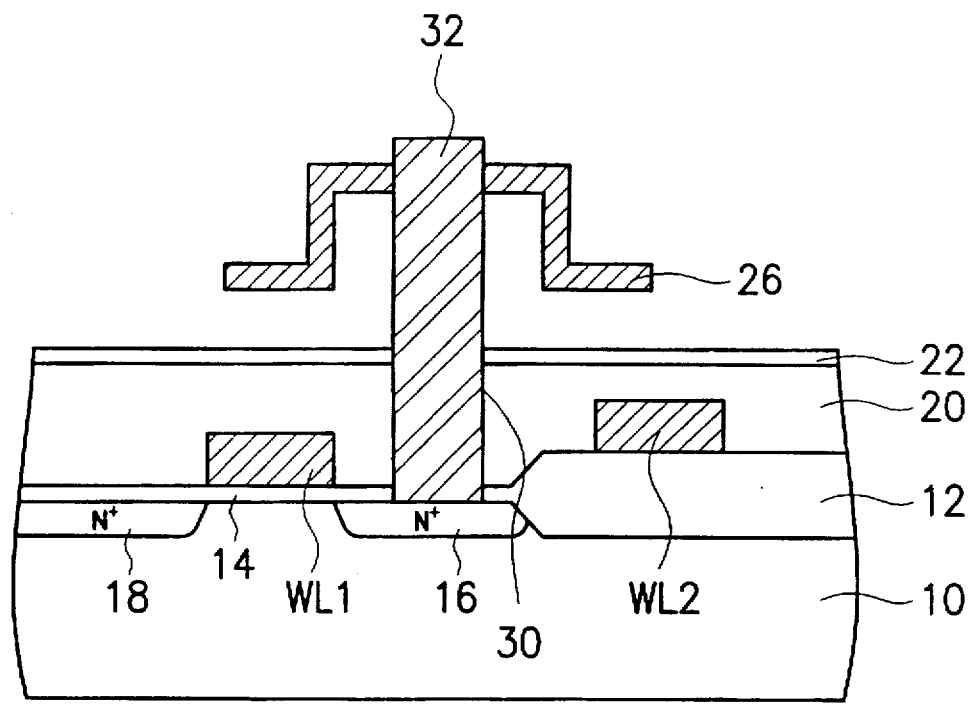

Referring to FIG. 2E, a polysilicon layer 32 is deposited by CVD so that the polysilicon layer 32 completely fills the contact hole 30 and covers the insulating layer 28. Ions such as arsenic can be implanted into the polysilicon layer 32 to increase its conductivity. The polysilicon layer 32 is etched back, using the insulating layer 28 as an etch end point, to form the polysilicon layer 32 with a solid cylinder shape. The exposed silicon dioxide layers (i.e., the insulating layers 28 and 24) are then removed using wet etching, using the etching protection layer 22 as an etch end point. The storage electrode of the storage capacitor of the DRAM cell is thus completed. The storage electrode includes a trunk-like polysilicon layer 32 and a branch-like polysilicon layer 26. The trunk-like polysilicon layer 32 is electrically connected to the drain region 16 and is pillar-shaped. The branch-like polysilicon layer 26 contacts the trunk-like polysilicon layer 32, extends substantially parallel to the upper surface of the substrate 10 for a certain distance then extends toward the substrate 10 for another certain distance, and then extends away from the trunk-like conductive layer 32 for another distance. Since the configuration of the storage electrode in accordance with the invention is special, it is termed a "tree-type storage electrode". The storage capacitor including the tree-type storage electrode is termed a "tree-type storage capacitor".

Figure 2F:
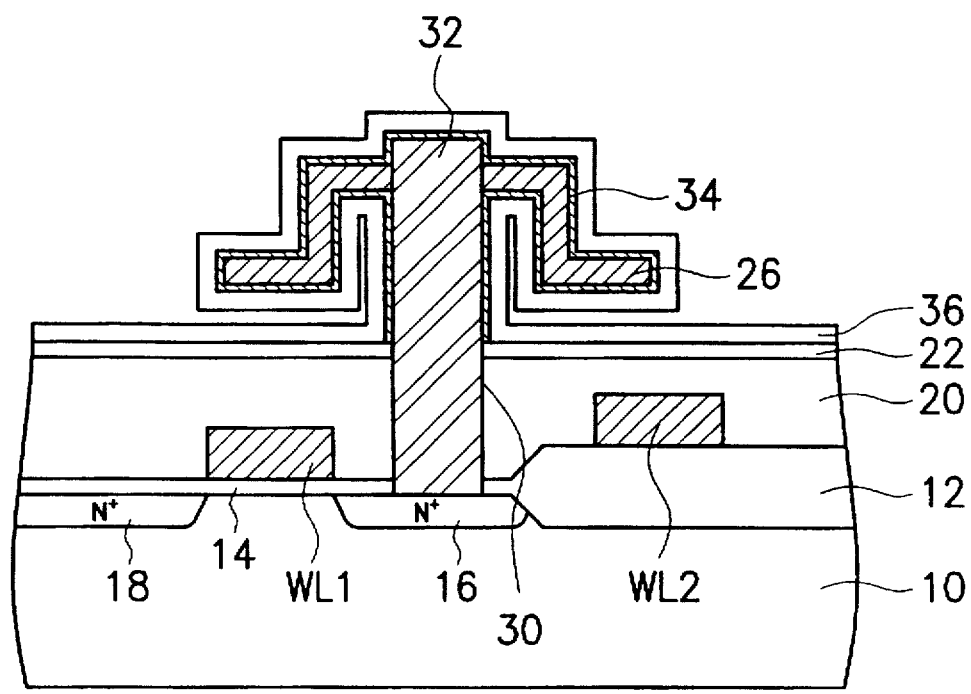

Referring to FIG. 2F, a dielectric film 34 is formed on the exposed surfaces of the polysilicon layer 32 and polysilicon layer 26. The dielectric film 34 can be made of dielectric materials such as silicon dioxide ($SiO_2$), silicon nitride, NO (silicon nitride/silicon dioxide), ONO (silicon dioxide/silicon nitride/silicon dioxide), or the like. Subsequently, an opposing electrode 36 made of polysilicon is formed over the dielectric film 34. The process for forming the opposing electrode 36 includes a first step of depositing a polysilicon layer by CVD to a thickness of, for example, approximately 1,000 angstroms, a second step of diffusing N-type impurities into the polysilicon layer so as to increase the conductivity thereof, and a final step of using a conventional photolithographic and etching process to define and etch away selected parts of the polysilicon layer. The fabrication of the tree-type capacitor of the DRAM cell is then complete.

Even though not shown in FIG. 2F, it is known by those skilled in this art that in order to complete the fabrication of the DRAM chip, further processes are necessary. The subsequent steps include fabricating bit lines, bonding pads, interconnections, passivations, and packaging. These steps involve only conventional techniques and are not related to the spirit of the invention, so that a detailed description thereof will not be provided herein.

As described above, the solid cylinder-shaped trunk-like conductive layer is formed by etching back the polysilicon layer 32. However, the solid cylinder-shaped trunk-like conductive layer can also be formed by growing epitaxial silicon in the contact hole 30.

Second Preferred Embodiment

In the foregoing first embodiment, the disclosed tree-type capacitor is provided with only one suspended branch-like polysilicon layer. However, the number of branch-like conductive layers is not limited to one, and can be two or more. The second embodiment of the invention is directed to a tree-type capacitor having two branch-like conductive layers, which will be described below with reference to FIGS. 3A through 3C.

The tree-type capacitor of the second embodiment is based on the wafer structure shown in FIG. 2C. Elements in FIGS. 3A through 3C that are identical to those in FIG. 2C are labeled with the same reference numerals.

Figure 3A:
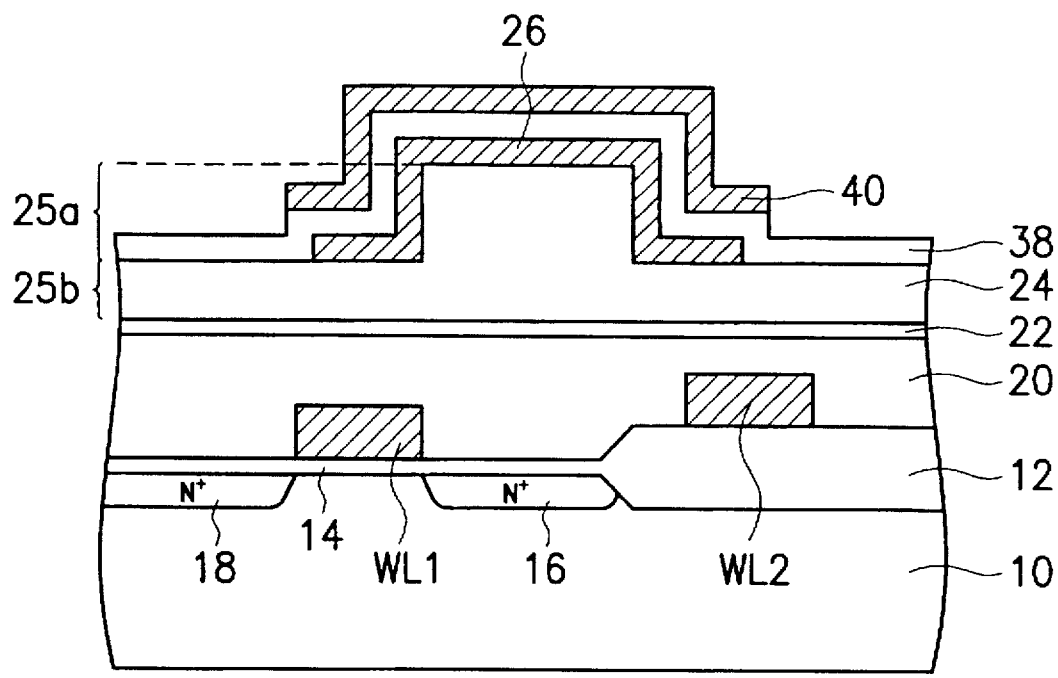
FIGS. 3A through 3C are cross-sectional views depicting the process steps for fabricating a second embodiment of a semiconductor memory cell having a tree-type capacitor according to the invention.

Referring to FIG. 3A, an insulating layer 38 and a polysilicon layer 40 are formed in succession over the surface of the polysilicon layer 26 and the hill-like insulating layer 24, using CVD. The insulating layer 38 can be a silicon dioxide layer with a thickness of about 1000 angstroms. Arsenic ions can be implanted into the polysilicon layer 40 to increase its conductivity. Next, a portion of the polysilicon layer 40 over the base 25b is removed, using conventional photolithography and etching techniques, to form the polysilicon layer 40 as shown in FIG. 3A.

Figure 3B:
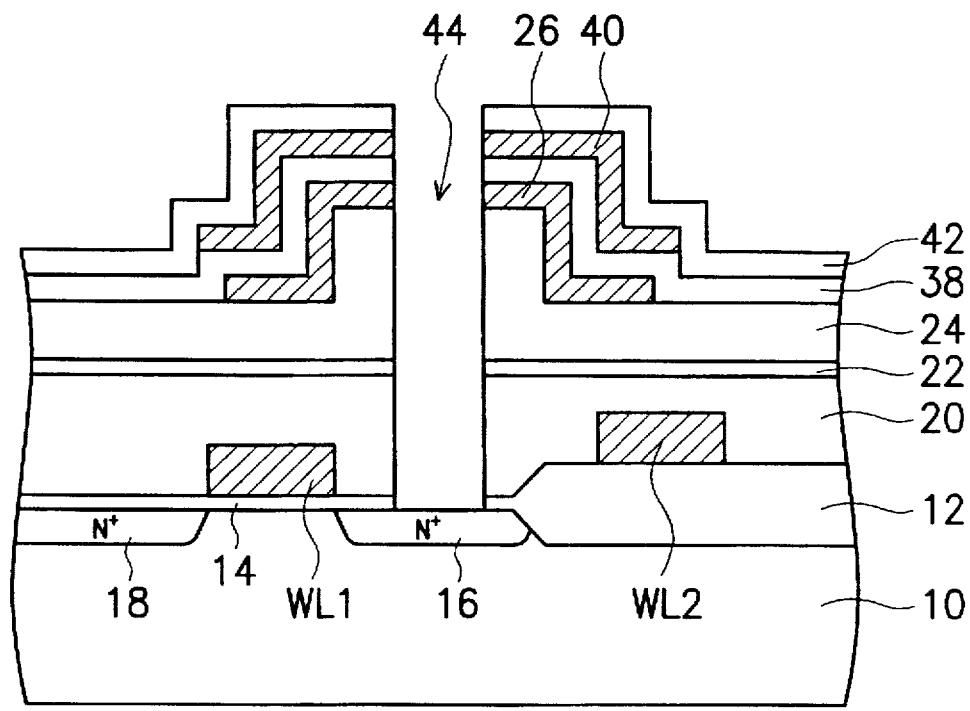

Referring to FIG. 3B, an insulating layer 42 is deposited on the polysilicon layer 40 and insulating layer 38, using CVD. The insulating layer 42 can be, for example, a silicon dioxide layer with a thickness of about 1000 angstroms. The insulating layer 42, the polysilicon layer 40, the insulating layer 38, the polysilicon layer 26, the hill-like insulating layer 24, the etching protection layer 22, the insulating layer 20 and the gate oxide layer 14 are etched in succession to form a contact hole 44 of the storage electrode which exposes a portion of the drain region 16.

Figure 3C:
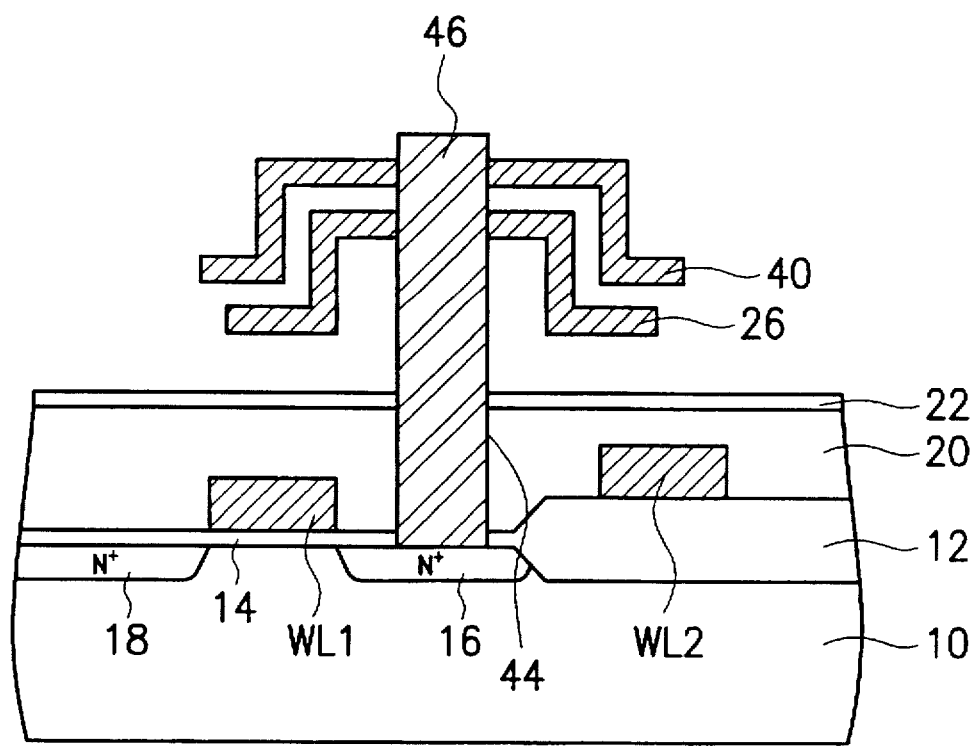

Referring to FIG. 3C, a polysilicon layer 46 is deposited by CVD so that the polysilicon layer 46 completely fills the contact hole 44 and covers the insulating layer 42. Ions such as arsenic can be implanted into the polysilicon layer 46 to increase its conductivity. The polysilicon layer 46 is etched back, using the insulating layer 42 as an etch end point, to form the polysilicon layer 46 with a solid cylinder shaft. The exposed silicon dioxide layers, i.e., the insulating layers 42, 38 and 24, are then removed using wet etching, using the etching protection layer 22 as an etch end point. The storage electrode of the storage capacitor of the DRAM cell is thus completed. The storage electrode includes a trunk-like polysilicon layer 46 and two branch-like polysilicon layers 40 and 26. The trunk-like polysilicon layer 46 is electrically connected to the drain region 16 and is pillar-shaped. The branch-like polysilicon layers 40 and 26 contact the trunk-like polysilicon layer 46, extend substantially parallel to the upper surface of the substrate 10 for a certain distance, then extend towards the substrate 10 for another certain distance, and then extend away from the trunk-like conductive layer 46 for another distance. Since further processes are similar to the conventional ones, they will not be described herein.

Third Preferred Embodiment

The trunk-like conductive layer of the storage electrode is an integrated conductive layer. However, the invention is also directed to a storage electrode including a number of trunk-like conductive layers as described herein.

The third preferred embodiment of the invention relates to a semiconductor memory device having a tree-type storage capacitor, and is described in detail with reference to FIG. 4A to FIG. 4C.

The tree-type storage capacitor of the third embodiment is based on the wafer structure of FIG. 2B. Elements in FIGS. 4A through 4C that are identical to those in FIG. 2B are labeled with the same reference numerals.

Figure 4A:
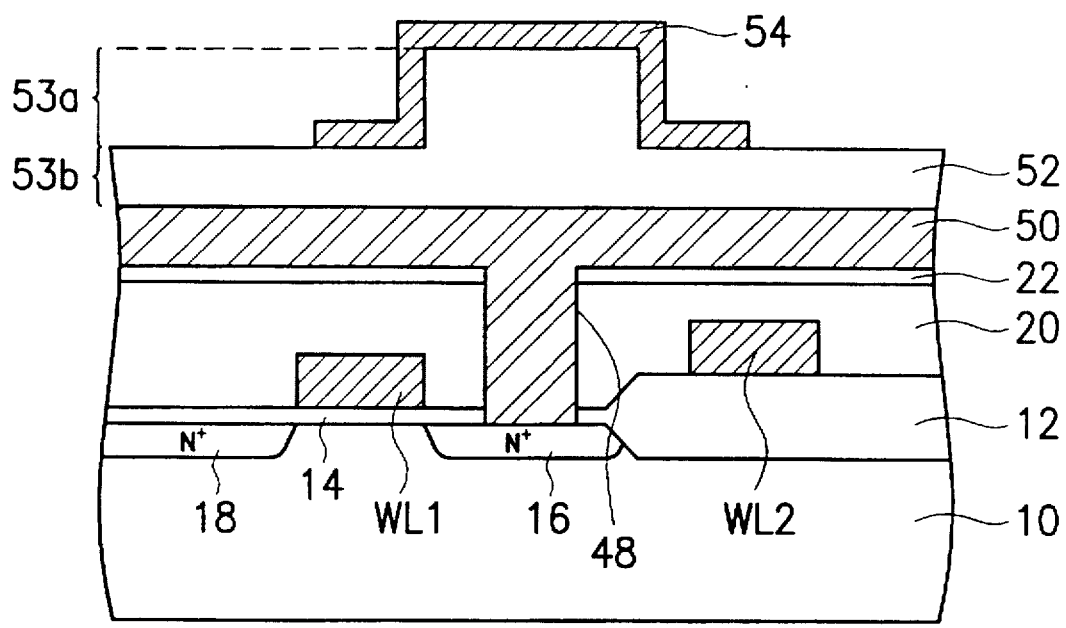
FIGS. 4A through 4C are cross-sectional views depicting the process steps for fabricating a third embodiment of a semiconductor memory cell having a tree-type capacitor according to the invention.

Referring to FIGS. 2B and 4A, the etching protection layer 22, the insulating layer 20 and the gate oxide layer 14 are etched using conventional photolithography and etching techniques, to form a contact hole 48, which exposes a portion of the drain region 16. Next, a polysilicon layer 50 is deposited by CVD. Ions such as arsenic can be implanted into the polysilicon layer 50 to increase its conductivity. As shown in FIG. 4A, the polysilicon layer 50 fully fills the contact hole 48 and covers the surface of the etching protection layer 22. Next, a thick insulating layer, such as a silicon dioxide layer with a thickness of about 7000 angstroms, is deposited by CVD. A portion of the thick insulating layer is etched, using conventional photolithography and etching techniques, to form a hill-like insulating layer 52. The hill-like insulating layer 52 includes a knoll 53a and a base 53b. The knoll 53a is substantially above the drain region 16. Next, a polysilicon layer 54 is deposited by CVD on the hill-like insulating layer 52. A portion of the polysilicon layer 54 above the base 53b is removed using conventional photolithography and etching techniques. The etched polysilicon layer 54 forms a portion of the storage electrode. The thickness of the polysilicon layer 54 can be, for example, 1000 angstroms. Ions, such as arsenic, can be implanted into the polysilicon layer 54 to increase its conductivity.

Figure 4B:
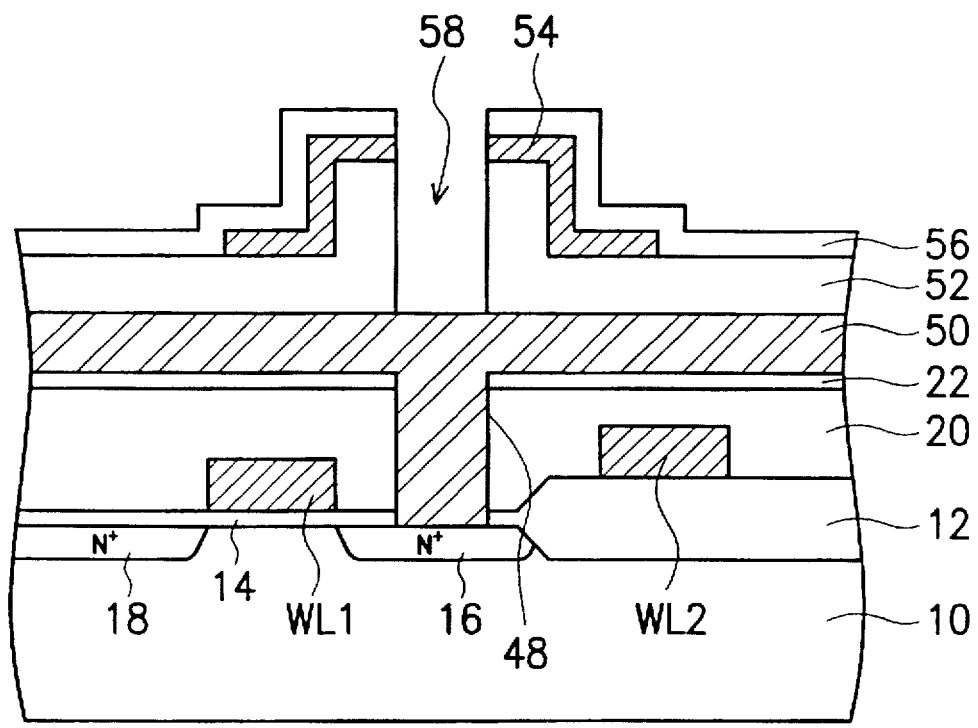

Referring to FIG. 4B, an insulating layer 56 is deposited over the polysilicon layer 54 and the insulating layer 52, using CVD. The insulating layer 56 can be a silicon dioxide layer with a thickness of about 1000 angstroms. Next, the insulating layer 56, the polysilicon layer 54 and the hill-like insulating layer 52 are etched in succession, using conventional photolithography and etching techniques, to form an opening 58 in the storage electrode which exposes a portion of the polysilicon layer 50.

Figure 4C:
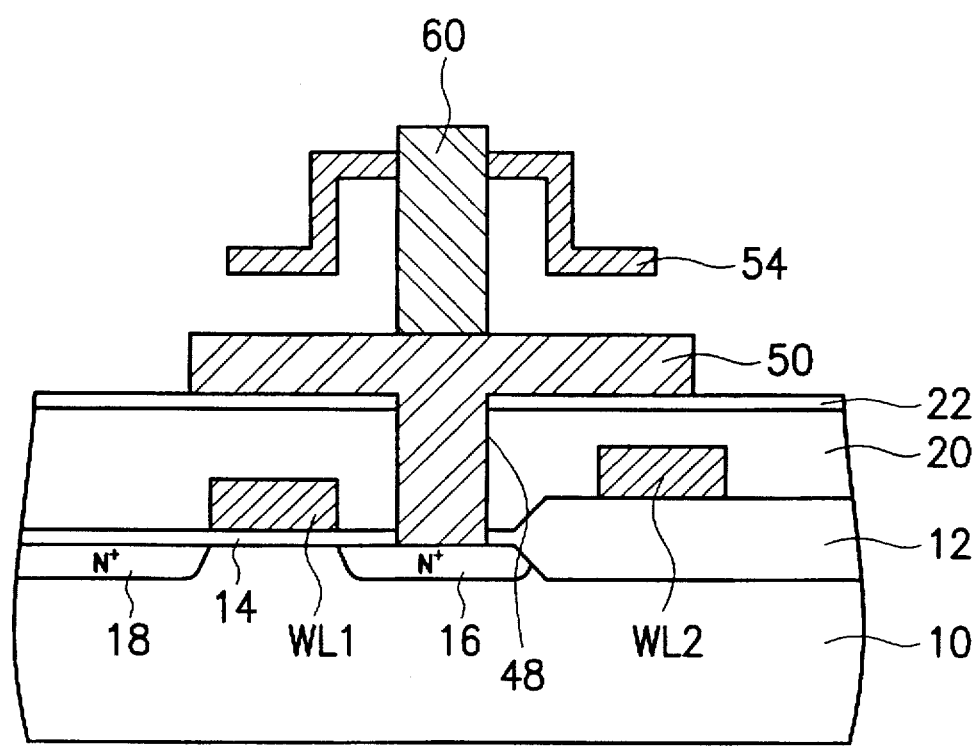

Referring to FIG. 4C, a polysilicon layer 60 is deposited by CVD so as to completely fill the opening 58 and cover the insulating layer 56. Ions such as arsenic can be implanted into the polysilicon layer 60 to increase its conductivity. The polysilicon layer 60 is etched back (patterned), using the insulating layer 56 as an etch end point, to form the polysilicon layer 60 with a solid cylinder shape. The exposed silicon dioxide layers, i.e., the insulating layers 56 and 52, are then removed using wet etching, using the etching protection layer 22 as an etch end point. The storage electrode of the storage capacitor of the DRAM cell is thus completed. The storage electrode includes a lower trunk-like polysilicon layer 50, an upper trunk-like conductive layer 60 and a branch-like polysilicon layer 54. The lower trunk-like polysilicon layer 50 is electrically connected to the drain region 16 and is T-shaped in cross section. The upper trunk-like polysilicon layer 60 contacts the upper surface of the lower trunk-like polysilicon layer 50 and extends substantially away from the substrate 10. The upper trunk-like polysilicon layer 60 is pillar-shaped. The branch-like polysilicon layer 54 contacts the upper trunk-like polysilicon layer 60, extends substantially parallel to the upper surface of the substrate 10 for a certain distance, then extends toward the substrate 10 for another certain distance, and then extends away from the trunk-like conductive layer 60 for another distance. Since further processes are similar to the conventional ones, they will not be described herein.

Fourth Preferred Embodiment

In the above-described preferred embodiments, the branch-like polysilicon layer is cap-shaped in cross section. However, alternative configurations of the branch-like polysilicon layer are also possible. In this fourth preferred embodiment, a storage electrode having a cap-shaped, branch-like conductive layer as viewed in cross-section, and a cross sectional stick-shaped branch-like conductive layer is disclosed. Moreover, in the third preferred embodiment, the bottom surface of the lower trunk-like polysilicon layer directly contacts the etching protection layer therebeneath. However, the invention is not so limited. The fourth embodiment includes a lower trunk-like polysilicon layer whose bottom surface does not directly contact the etching protection layer. Therefore, the surface area of the storage electrode is further increased.

The fourth preferred embodiment of the invention relating to a semiconductor memory device with a tree-type storage capacitor is described in detail with reference to FIG. 5A to FIG. 5C.

The tree-type storage capacitor of the fourth embodiment is based on the wafer structure of FIG. 2B. Elements in FIGS. 5A through 5C that are identical to those in FIG. 2B are labeled with the same reference numerals.

Figure 5A:
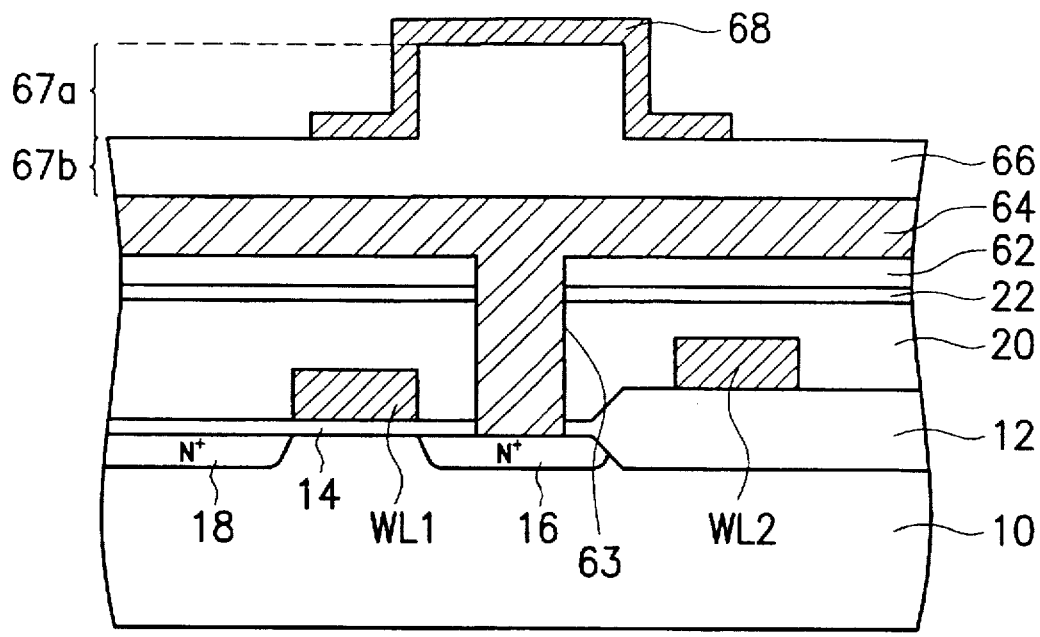
FIGS. 5A through 5C are cross-sectional views depicting the process steps for fabricating a fourth embodiment of a semiconductor memory cell having a tree-type capacitor according to the invention.

Referring to FIGS. 2B and 5A, an insulating layer 62 is deposited on the surface of the etching protection layer 22 using CVD. The insulating layer 62 can be, for example, a silicon dioxide layer having a thickness of about 2000 angstroms. Next, the insulating layer 62, the etching protection layer 22, the insulating layer 20 and the gate oxide layer 14 are etched in succession, using conventional photolithography and etching techniques, to form a contact hole 63 in the storage electrode. The contact hole exposes a portion of the drain region 16. Next, a polysilicon layer 64 is deposited by CVD. Ions such as arsenic can be implanted into the polysilicon layer 64 to increase its conductivity. As shown in FIG. 5A, the polysilicon layer 64 fully fills the contact hole 63 and covers the surface of the insulating layer 62. Next, a thick insulating layer, such as a silicon dioxide layer having a thickness of about 7000 angstroms, is deposited by CVD. A portion of the thick insulating layer is etched, using conventional photolithography and etching techniques, to form a hill-like insulating layer 66. The hill-like insulating layer 66 includes a knoll 67a and a base 67b. The knoll 67a is substantially above the drain region 16. Next, a polysilicon layer 68 is deposited by CVD on the hill-like insulating layer 66. A portion of the polysilicon layer 68 above the base 67b is removed using conventional photolithography and etching techniques. The etched polysilicon layer 68 forms a portion of the storage electrode. The thickness of the polysilicon layer 68 can be, for example, 1000 angstroms. Ions, such as arsenic, can be implanted into the polysilicon layer 68 to increase its conductivity.

Figure 5B:
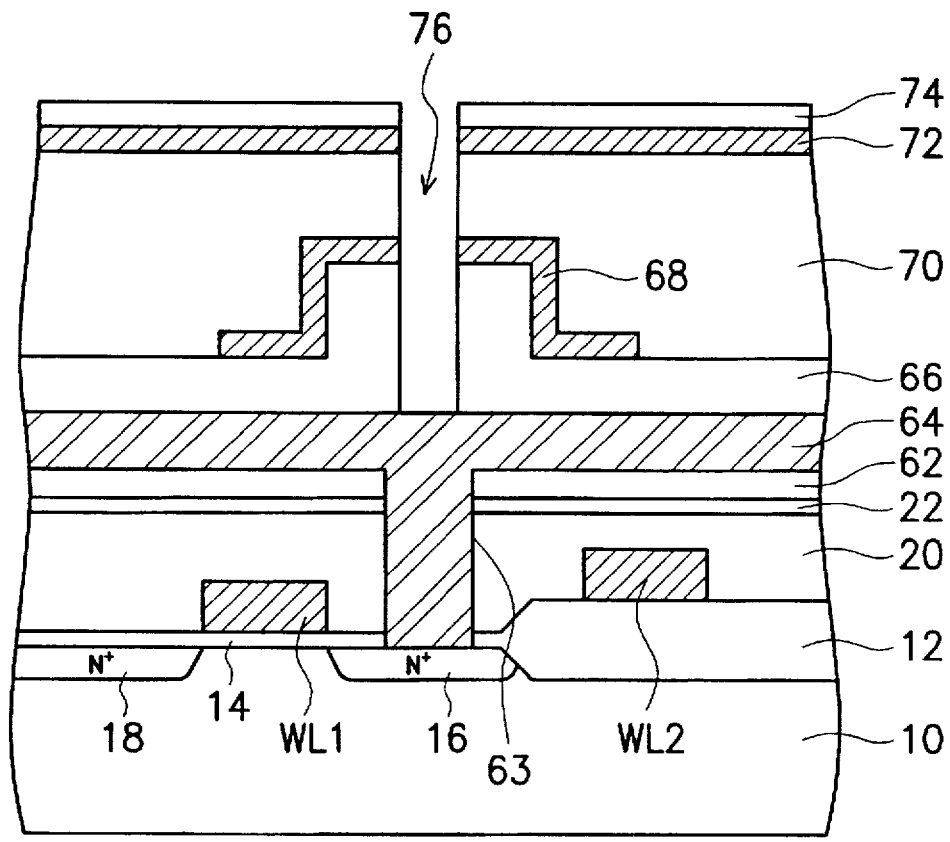

Referring to FIG. 5B, a thick insulating layer 70 is deposited over the polysilicon layer 68 and the hill-like insulating layer 66 using CVD. The insulating layer 70 can be a silicon dioxide layer with a thickness of about 7000 angstroms. A polysilicon layer 72 and an insulating layer 74, each having a thickness of about 1000 angstroms, are deposited in succession using CVD. The insulating layer 74 can be a silicon dioxide layer. Ions, such as arsenic, can be implanted into the polysilicon layer 72 to increase its conductivity. Next, the insulating layer 74, the polysilicon layer 72, the insulating layer 70, the polysilicon layer 68 and the hill-like insulating layer 66 are etched in succession, using conventional photolithography and etching techniques, to form an opening 76 in the storage electrode which exposes a portion of the polysilicon layer 64.

Figure 5C:
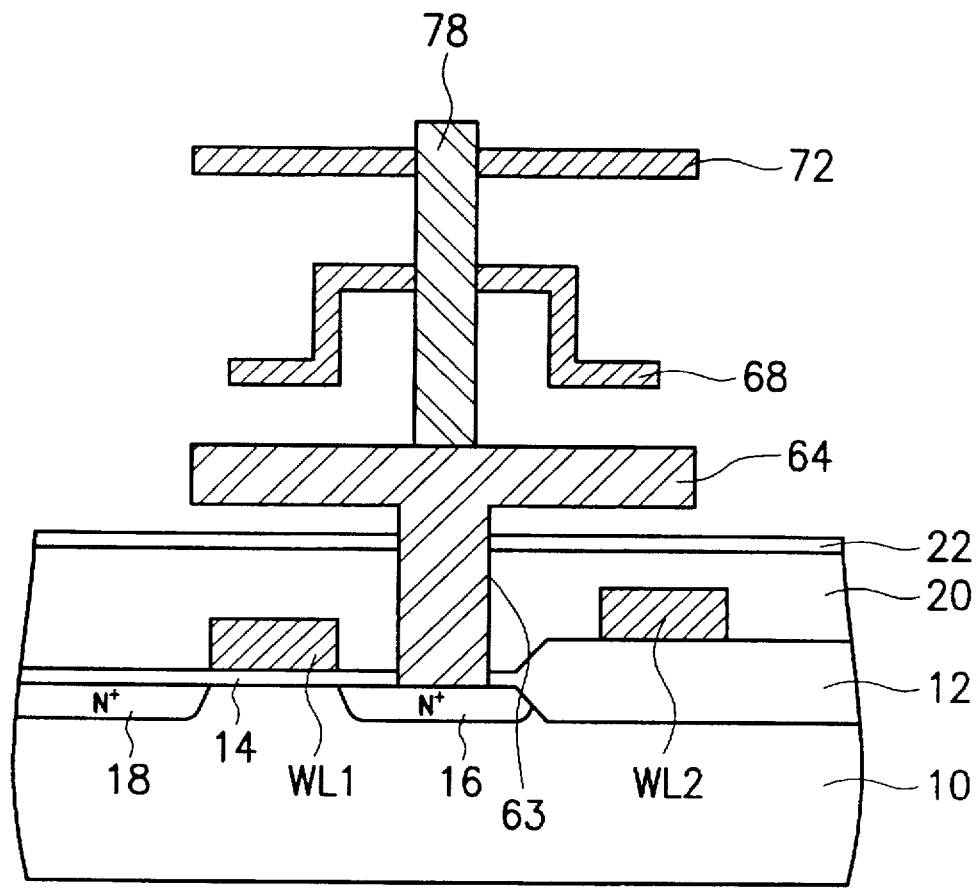

Referring to FIG. 5C, a polysilicon layer 78 is deposited by CVD so as to completely fill the opening 76 and cover the insulating layer 74. Ions such as arsenic can be implanted into the polysilicon layer 78 to increase its conductivity. The polysilicon layer 78 is polished, using a chemical mechanical polish technique, until the upper surface of the insulating layer 74 is exposed, thus forming the polysilicon layer 78 with a solid cylinder shape. The polysilicon layers 72 and 64 are patterned, using conventional photolithography and etching techniques, to complete the storage electrode of the storage capacitor. The exposed silicon dioxide layers, i.e., the insulating layers 74, 70, 66 and 62, are then removed using wet etching, using the etching protection layer 22 as an etch end point. The storage electrode of the storage capacitor of the DRAM cell is thus completed. The storage electrode includes a lower trunk-like polysilicon layer 64, an upper trunk-like conductive layer 78, a cap-shaped branch-like polysilicon layer 68 and a stick-shaped branch-like polysilicon layer 72. The lower trunk-like polysilicon layer 64 is electrically connected to the drain region 16 and is T-shaped in cross section. The upper trunk-like polysilicon layer 78 contacts the upper surface of the lower trunk-like polysilicon layer 64 and extends substantially away from the substrate 10. The upper trunk-like polysilicon layer 78 is pillar-shaped. The cross sectional stick-shaped branch-like polysilicon layer 72 contacts the upper trunk-like polysilicon layer 78 and extends substantially parallel to the upper surface of the substrate 10. The branch-like polysilicon layer 68 contacts the upper trunk-like polysilicon layer 78, extends substantially parallel to the upper surface of the substrate 10, then extends toward the substrate 10, and then extends away from the upper trunk-like conductive layer 78. Since further processes are similar to the conventional ones, they will not be described herein.

It is clear to those skilled in the art that the characteristics of the above-mentioned preferred embodiments can also be applied together to form storage electrodes and storage capacitors with various structures. Such various structures of the storage electrode and the storage capacitor are all contemplated to be within the scope of the invention.

Although in the accompanying drawings the embodiments of the drains of the transfer transistors are based on diffusion areas in a silicon substrate, other variations, for example trench-type drain regions, are possible.

Although not shown in the second to fourth embodiments, a dielectric layer is formed on the exposed surfaces of the conductive layers in a manner similar to that described in connection with the first embodiment. Likewise, a conductive layer is formed on the surface of the dielectric layer in a manner similar to that described in connection with the first embodiment.

Elements in the accompanying drawings are schematic diagrams for demonstrative purposes, and do not depict the actual scale. The dimensions of the elements of the invention as shown should by no means be considered limitations on the scope of the invention.

While the invention has been described by way of example and in terms of preferred embodiments, it is to be understood that the invention is not limited thereto. To the contrary, it is intended to cover various modifications and similar arrangements and procedures, and the scope of the appended claims therefore should be accorded the broadest interpretation so as to encompass all such modifications and similar arrangements and procedures.

What is claimed is:

1. A method of forming a storage electrode of a storage capacitor of a semiconductor memory device, the semiconductor memory device further comprising a substrate, and a transfer transistor formed on the substrate and having a source/drain region, the storage capacitor being electrically connected to the source/drain region of the transfer transistor, the method comprising:

a. forming a first insulating layer over the transfer transistor;

b. forming a first conductive layer over the first insulating layer and penetrating at least the first insulating layer, and being electrically connected to the source/drain region of the transfer transistor;

c. forming a second insulating layer on the first conductive layer, the second insulating layer having a knoll positioned substantially over the source/drain region;

d. forming a second conductive layer on the second insulating layer, the second conductive layer covering at least the knoll of the second insulating layer;

e. forming a third insulating layer over at least the second conductive layer;

f. forming an opening through the third insulating layer, the second conductive layer and the second insulating layer so that a portion of the first conductive layer is exposed;

g. forming a third conductive layer in the opening;

h. patterning the first conductive layer so that the first and third conductive layers form a trunk-like conductive layer, and the second conductive layer forms a branch-like conductive layer; the storage electrode including the trunk-like and branch-like conductive layers; and i. removing the second and third insulating layers to expose at least some surfaces of the first, second and third conductive layers.

2. A method as claimed in claim 1, further comprising the steps of forming a dielectric layer on the exposed surfaces of the first, second, and third conductive layers, and forming a fourth conductive layer on a surface of the dielectric layer to form an opposed electrode of the storage capacitor.

3. A method as claimed in claim 1, wherein the first conductive layer forms a lower trunk-like conductive layer, and the third conductive layer forms an upper trunk-like conductive layer, the lower trunk-like conductive layer being electrically connected to the source/drain region, and the upper trunk-like conductive layer contacting the lower trunk-like conductive layer and extending away from the substrate.

4. A method as claimed in claim 3, wherein the lower trunk-like conductive layer is T-shaped in cross section.

5. A method as claimed in claim 3, wherein the upper trunk-like conductive layer is substantially formed as a solid cylinder.

6. A method as claimed in claim 1, wherein step (g) includes the substeps of depositing a polysilicon layer on an upper surface of the third insulating layer and in the opening, and removing the polysilicon layer on the upper surface of the third insulating layer by etching back to form the third conductive layer in the opening.

7. A method as claimed in claim 1, wherein in step (g), the third conductive layer is an epitaxially grown polysilicon layer.

8. A method as claimed in claim 1, wherein step (g) includes the substeps of depositing a polysilicon layer on an upper surface of the third insulating layer and in the opening, and removing the polysilicon layer on the upper surface of the third insulating layer by chemical mechanical polishing to form the third conductive layer in the opening.

9. A method as claimed in claim 1, further comprising the step of forming an etching protection layer on the first insulating layer which is performed after step (a) and before step (b), wherein in step (b), the first conductive layer penetrates the etching protection layer.

10. A method as claimed in claim 1, further comprising the steps of forming, after step (e), a fourth conductive layer on the third insulating layer and over at least the knoll of the second insulating layer; and forming, before step (f), a fourth insulating layer on the fourth conductive layer, wherein the second and fourth conductive layers form substantially parallel branch-like conductive layers, and wherein the opening in step (f) is additionally formed through the fourth insulating layer and the fourth conductive layer.

11. A method as claimed in claim 10, further comprising the step of forming a dielectric layer on exposed surfaces of the first, second third and fourth conductive layers.

12. A method as claimed in claim 10, wherein the first conductive layer forms a lower trunk-like conductive layer, and the third conductive layer forms an upper trunk-like conductive layer, the lower trunk-like conductive layer being electrically connected to the source/drain region, and the upper trunk-like conductive layer contacting the lower trunk-like conductive layer and extending away from the substrate.

13. A method as claimed in claim 12, wherein the lower trunk-like conductive layer is T-shaped in cross section.

14. A method as claimed in claim 12, wherein the upper trunk-like conductive layer is substantially formed as a solid cylinder.

15. A method as claimed in claim 10, wherein step (g) includes the substeps of depositing a polysilicon layer on an upper surface of the fourth insulating layer and in the opening, and removing the polysilicon layer on the upper surface of the fourth insulating layer by etching back to form the third conductive layer in the opening.

16. A method as claimed in claim 10, wherein in step (g), the third conductive layer is an epitaxially grown polysilicon layer.

17. A method as claimed in claim 10, wherein step (g) includes the substeps of depositing a polysilicon layer on an upper surface of the fourth insulating layer and in the opening, and removing the polysilicon layer on the upper surface of the fourth insulating layer by chemical mechanical polishing to form the third conductive layer in the opening.

18. A method as claimed in claim 10, further comprising the steps of forming, before step (f), a fifth conductive layer on the fourth insulating layer, wherein an upper surface of the fourth insulating layer is substantially parallel to an upper surface of the substrate; and forming, before step (f), a fifth insulating layer on the fifth conductive layer, wherein in step (f), the opening is additionally formed through the fifth conductive layer and the fifth insulating layer, and wherein step (h) further includes the substep of patterning the fifth conductive layer to form the fifth conductive layer as a branch-like conductive layer, and step (i) further includes the substep of removing the fifth insulating layer to expose a surface of the fifth conductive layer.

19. A method as claimed in claim 18, further comprising the step of forming a dielectric layer on exposed surfaces of the first, second, third, fourth and fifth conductive layers.

20. A method as claimed in claim 18, wherein step (g) includes the substeps of depositing a polysilicon layer on an upper surface of the fifth insulating layer and in the opening, and removing the polysilicon layer on the upper surface of the fifth insulating layer by etching back to form the third conductive layer in the opening.

21. A method as claimed in claim 18 wherein in step (g), the third conductive layer is an epitaxially grown polysilicon layer.

22. A method as claimed in claim 19, wherein step (g) includes the substeps of depositing a polysilicon layer on an upper surface of the fifth insulating layer and in the opening, and removing the polysilicon layer on the upper surface of the fifth insulating layer by chemical mechanical polishing to form the third conductive layer in the opening.

23. A method as claimed in claim 10, further comprising the steps of:

forming, after step (e), a fourth conductive layer on the third insulating layer, wherein in step (e), an upper surface of the third insulating layer is substantially parallel to an upper surface of the substrate; and forming, before step (f), a fourth insulating layer on the fourth conductive layer wherein step (f) further includes the substep of forming the opening additionally through the fourth conductive layer and the fourth insulating layer;

step (h) further includes the substep of patterning the fourth conductive layer so that the fourth conductive layer forms an additional branch-like conductive layer; and step (i) further includes the substep of removing the fourth insulating layer to expose a surface of the fourth conductive layer.

24. A method as claimed in claim 23, further comprising the step of forming a dielectric layer on exposed surfaces of the first, second, third and fourth conductive layers.

25. A method as claimed in claim 23, wherein step (g) includes the substeps of depositing a polysilicon layer on an upper surface of the fourth insulating layer and in the opening, and removing the polysilicon layer on the upper surface of the fourth insulating layer by etching back to form the third conductive layer in the opening.

26. A method as claimed in claim 23, wherein in step (g), the third conductive layer is an epitaxially grown polysilicon layer.

27. A method as claimed in claim 23, wherein step (g) includes the substeps of depositing a polysilicon layer on an upper surface of the fourth insulating layer and in the opening, and removing the polysilicon layer on the upper surface of the fourth insulating layer by chemical mechanical polishing to form the third conductive layer in the opening.

28. A method as claimed in claim 1, further comprising the step of forming, after step (a) and before step (b), an etching protection layer on the first insulating layer, and a fourth insulating layer on the etching protection layer, wherein in step (b), the first conductive layer additionally penetrates the fourth insulating layer and the etching protection layer; and step (i) further includes the substep of removing the fourth insulating layer.

29. A method as claimed in claim 28, wherein step (g) includes the substeps of depositing a polysilicon layer on an upper surface of the third insulating layer and in the opening, and removing the polysilicon layer on the upper surface of the third insulating layer by etching back to form the third conductive layer in the opening.

30. A method as claimed in claim 28, wherein in step (g), the third conductive layer is an epitaxially grown polysilicon layer.

31. A method as claimed in claim 28, wherein step (g) includes the substeps of depositing, a polysilicon layer on an upper surface of the third insulating layer and in the opening, and removing the polysilicon layer on the upper surface of the third insulating layer by chemical mechanical polishing to form the third conductive layer in the opening.

32. A method as claimed in claim 28 further comprising the steps of forming, after step (e), a fourth conductive layer on the third insulating layer and over at least the knoll of the second insulating layer; and forming, before step (f), a fifth insulating layer on the fourth conductive layer, wherein the second and fourth conductive layers form substantially parallel branch-like conductive layers, and wherein the opening in step (f) is additionally formed through the fifth insulating layer and the fourth conductive layer.

33. A method as claimed in claim 32, further comprising the step of forming a dielectric layer on exposed surfaces of the first, second, third and fourth conductive layers.

34. A method as claimed in claim 32, wherein step (g) includes the substeps of depositing a polysilicon layer on an upper surface of the fifth insulating layer and in the opening, and removing the polysilicon layer on the upper surface of the fifth insulating layer by etching back to form the third conductive layer in the opening.

35. A method as claimed in claim 32, wherein in step (g), the third conductive layer is an epitaxially grown polysilicon layer.

36. A method as claimed in claim 32, wherein step (g) includes the substeps of depositing a polysilicon layer on an upper surface of the fifth insulating layer and in the opening, and removing the polysilicon layer on the upper surface of the fifth insulating layer by chemical mechanical polishing to form the third conductive layer in the opening.

37. A method as claimed in claim 32, further comprising the steps of forming, after step (e), a fifth conductive layer on the fifth insulating layer, an upper surface of the fifth insulating layer being substantially parallel to an upper surface of the substrate; and forming, before step (f), a sixth insulating layer on the fifth conductive layer, wherein in step (f), the opening is additionally formed through the fifth conductive layer and the sixth insulating layer; and wherein step (h) further includes the substep of patterning the fifth conductive layer to form the fifth conductive layer as a branch-like conductive layer; and step (i) further includes the substep of removing the sixth and fifth insulating layers to expose a surface of the fourth and fifth conductive layers.

38. A method as claimed in claim 37, further comprising the step of forming a dielectric layer on the exposed surfaces of the first, second, third, fourth and fifth conductive layers.

39. A method as claimed in claim 37, wherein step (g) includes the substeps of depositing a polysilicon layer on an upper surface of the sixth insulating layer and in the opening, and removing the polysilicon layer on the surface of the sixth insulating layer by etching back to form the third conductive layer in the opening.

40. A method as claimed in claim 37, wherein in step (g) the third conductive layer is an epitaxially grown polysilicon layer.

41. A method as claimed in claim 37, wherein step (g) includes the substeps of depositing a polysilicon layer on an upper surface of the sixth insulating layer and in the opening, and removing the polysilicon layer on the upper surface of the sixth insulation layer by chemical mechanical polishing to form the third conductive layer in the opening.

42. A method of forming a storage electrode of a storage capacitor of a semiconductor memory device, the semiconductor memory device further comprising a substrate, and a transfer transistor formed on the substrate and having a source/drain region, the storage capacitor being electrically connected to the source/drain region of the transfer transistor, the method comprising:

a. forming a first insulating layer over the transfer transistor;

b. forming a second insulating layer over the first insulating layer, the second insulating layer having a knoll positioned substantially over the source/drain region;

c. forming a first conductive layer on a portion of the second insulating layer and at least over the knoll of the second insulating layer;

d. forming a third insulating layer over at least the first conductive layer and over the knoll;

e. forming an opening through the third insulating layer, the first conductive layer, the second insulating layer and the first insulating layer so that the source/drain region is exposed;

f. forming a second conductive layer in the opening so that the second conductive layer is electrically connected to the source/drain region; wherein
the second conductive layer forms a trunk-like conductive layer;
the first conductive layer forms a branch-like conductive layer; and
the storage electrode includes the trunk-like and branch-like conductive layers; and g. removing the second and third insulating layers to expose at least some surfaces of the first and second conductive layers.

43. A method as claimed in claim 42, further comprising the steps of forming a dielectric layer on the exposed surfaces of the first and second conductive layers; and forming a third conductive layer on a surface of the dielectric layer to form an opposed electrode of the storage capacitor.

44. A method as claimed in claim 42, wherein the trunk-like conductive layer is substantially formed as a solid cylinder.

45. A method as claimed in claim 42, wherein step (f) includes the substeps of depositing a polysilicon layer on an upper surface of the third insulating layer and in the opening, and removing the polysilicon layer on the upper surface of the third insulating layer by etching back to form the second conductive layer in the opening.

46. A method as claimed in claim 42, wherein in step (f), the second conductive layer is an epitaxially grown polysilicon layer.

47. A method as claimed in claim 42, wherein step (f) includes the substeps of depositing a polysilicon layer on an upper surface of the third insulating layer and in the opening, and removing the polysilicon layer on the upper surface of the third insulting layer by chemical mechanical polishing to form the second conductive layer in the opening.

48. A method as claimed in claim 42, further comprising the step of forming an etching protection layer on the first insulating layer after step (a) and before step (b), wherein step (e) further includes the substep of forming the opening through the etching protection layer.

49. A method as claimed in claim 42, further comprising the steps of forming, after step (d) and before step (e) a third conductive layer over the third insulating layer and forming a fourth insulating layer over the third conductive layer, wherein the first and third conductive layers form substantially parallel branch-like conductive layers and wherein step (e) includes the substep of additionally forming the opening through the third conductive layer and the fourth insulating layer, and wherein a dielectric layer is formed on exposed surfaces of the first, second, and third conductive layers.

50. A method as claimed in claim 49, wherein the trunk-like conductive layer is substantially formed as a solid cylinder.

51. A method as claimed in claim 49, wherein step (f) includes the substeps of depositing a polysilicon layer on an upper surface of the fourth insulating layer and in the opening, and removing the polysilicon layer on the upper surface of the fourth insulating layer by etching back to form the second conductive layer in the opening.

52. A method as claimed in claim 49, wherein in step (f), the second conductive layer is an epitaxially grown polysilicon layer.

53. A method as claimed in claim 49, wherein step (f) includes the substeps of depositing a polysilicon layer on an upper surface of the fourth insulating layer and in the opening, and removing the polysilicon layer on the upper surface of the fourth insulating layer by chemical mechanical polishing to form the second conductive layer in the opening.

54. A method as claimed in claim 42, further comprising the steps of forming, after step (d), a third conductive layer on the third insulating layer, an upper surface of the third insulating layer being substantially parallel to an upper surface of the substrate; and forming, before step (e), a fourth insulating layer on the third conductive layer; wherein in step (e), the opening is additionally formed through the third conductive layer and the fourth insulating layer; and wherein step (f) further includes the step of patterning the third conductive layer so that the third conductive layer forms a branch-like conductive layer; and step (g) further includes the substep of removing the fourth insulating layer to expose a surface of the third conductive layer.

55. A method as claimed in claim 54, further comprising the step of forming a dielectric layer on the exposed surfaces of the first, second and third conductive layers.

56. A method as claimed in claim 54, wherein step (f) includes the substeps of depositing a polysilicon layer on an upper surface of the fourth insulating layer and in the opening, and removing the polysilicon layer on the upper surface of the fourth insulating layer by etching back to form the second conductive layer in the opening.

57. A method as claimed in claim 54, wherein in step (f), the second conductive layer is an epitaxially grown polysilicon layer.

58. A method as claimed in claim 54, wherein step (f) includes the substep of depositing a polysilicon layer on an upper surface of the fourth insulating layer and in the opening, and removing the polysilicon layer on the upper surface of the fourth insulating layer by chemical mechanical polishing to form the second conductive layer in the opening.

* * * * *